(12) United States Patent
Bonora et al.

(10) Patent No.: US 6,704,998 B1
(45) Date of Patent: *Mar. 16, 2004

(54) PORT DOOR REMOVAL AND WAFER HANDLING ROBOTIC SYSTEM

(75) Inventors: Anthony C. Bonora, Menlo Park, CA (US); William J. Fosnight, Austin, TX (US); Raymond S. Martin, San Jose, CA (US)

(73) Assignee: Asyst Technologies, Inc., Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/998,115

(22) Filed: Dec. 24, 1997

(51) Int. Cl.[7] .......................... B65G 49/07; B25J 15/00
(52) U.S. Cl. .......................... 29/700; 29/822; 414/217; 414/935; 414/939; 414/941; 901/30; 901/31; 901/40
(58) Field of Search .................. 414/935, 939, 414/940, 217, 937, 941; 29/700, 722, 743, 744, 822; 901/30, 31, 36, 40

(56) References Cited

U.S. PATENT DOCUMENTS

| | | | | |
|---|---|---|---|---|
| 4,616,683 A | | 10/1986 | Tullis et al. | |
| 4,746,256 A | * | 5/1988 | Boyle et al. | 414/217 |
| 4,781,511 A | * | 11/1988 | Harada et al. | |
| 5,291,923 A | * | 3/1994 | Gallagher et al. | |
| 5,364,219 A | | 11/1994 | Takahashi et al. | |
| 5,451,131 A | * | 9/1995 | Hecht et al. | |
| 5,586,585 A | * | 12/1996 | Bonora et al. | |
| 5,607,276 A | * | 3/1997 | Muka et al. | |
| 5,609,459 A | | 3/1997 | Muka | |
| 5,621,982 A | * | 4/1997 | Yamashita et al. | |
| 5,740,845 A | * | 4/1998 | Bonora et al. | |
| 5,765,444 A | * | 6/1998 | Bacchi et al. | 901/40 |
| 6,068,704 A | * | 5/2000 | Saeki et al. | 414/939 |

* cited by examiner

*Primary Examiner*—Gregory Vidovich
*Assistant Examiner*—Jermie E. Cozart
(74) *Attorney, Agent, or Firm*—O'Melveny & Myers LLP (57) ABSTRACT

An I/O minienvironment including a port door within an I/O port, and a system for removing the port door and pod door coupled thereto, and setting down the pod and port doors at a convenient location within the I/O minienvironment. After wafer processing has been completed and the wafers have been transferred back through the I/O port to the SMEF pod, the system may retrieve the port and pod doors, and return the port door to their sealing positions within the I/O port and cassette, respectively. In a preferred embodiment, the system for gripping and transporting the port and pod doors may be located on the back end of the end effector of the wafer handling robot within the I/O minienvironment. The back end of the end effector is the end of the end effector opposite that used to transport the wafers and/or cassette.

21 Claims, 11 Drawing Sheets

PORT DOOR REMOVAL AND WAFER HANDLING ROBOTIC SYSTEM

BACKGROUND OF THE INVENTION

1. Field of the Invention

The present invention relates to the transport and processing of semiconductor wafers, and in particular to a system wherein a wafer handling robot includes mechanisms for gripping and removing pod and port doors from an I/O port of a SMIF minienvironment, and storing the doors at a convenient location within the minienvironment during wafer transfer through the port.

2. Description of Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system has three main components: (1) minimum volume, sealed pods used for storing and transporting wafers and/or wafer cassettes; (2) an input/output (I/O) minienvironment located on a semiconductor processing tool to provide a miniature clean space (upon being filled with clean air) in which exposed wafers and/or wafer cassettes may be transferred to and from the interior of the processing tool; and (3) an interface for transferring the wafers and/or wafer cassette between the SMIF pods and the SMIF minienvironment without exposure of the wafers or cassettes to particulates. Further details of one proposed SMIF system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.1 $\mu$m and below. In the future, geometries will become smaller and smaller and hence smaller and smaller contamination particles become of interest.

There are in general two types of SMIF pods: front opening and bottom opening. A front opening SMIF pod generally comprises a cover which may either be adapted for housing a wafer cassette, or may include shelves for supporting the wafers directly therein without a wafer cassette. The front opening pod further comprises a vertically oriented door mating with the cover. A bottom opening SMIF pod generally comprises a cover mating with a door located on a bottom surface of the pod. In order to transfer wafers and/or a wafer cassette from within the SMIF pod to within an I/O minienvironment on a processing tool, a door of the pod is supported on an I/O port of the minienvironment. The pod is designed so that the pod door overlies a port door covering the I/O port of the minienvironment, and the pod cover overlies a port plate surrounding the port door. Once located at the I/O port, mechanisms within the port door release and separate the pod door from the pod cover. Thereafter, the port door and pod door are brought into the I/O minienvironment, and moved together either up, down, or to the side of the minienvironment port to clear a path for the wafers and/or cassette to be transferred through the port. While the port and pod doors are retracted within the minienvironment, the pod cover generally remains affixed to the I/O port to prevent contaminants from entering the minienviromnent.

Figure 1:
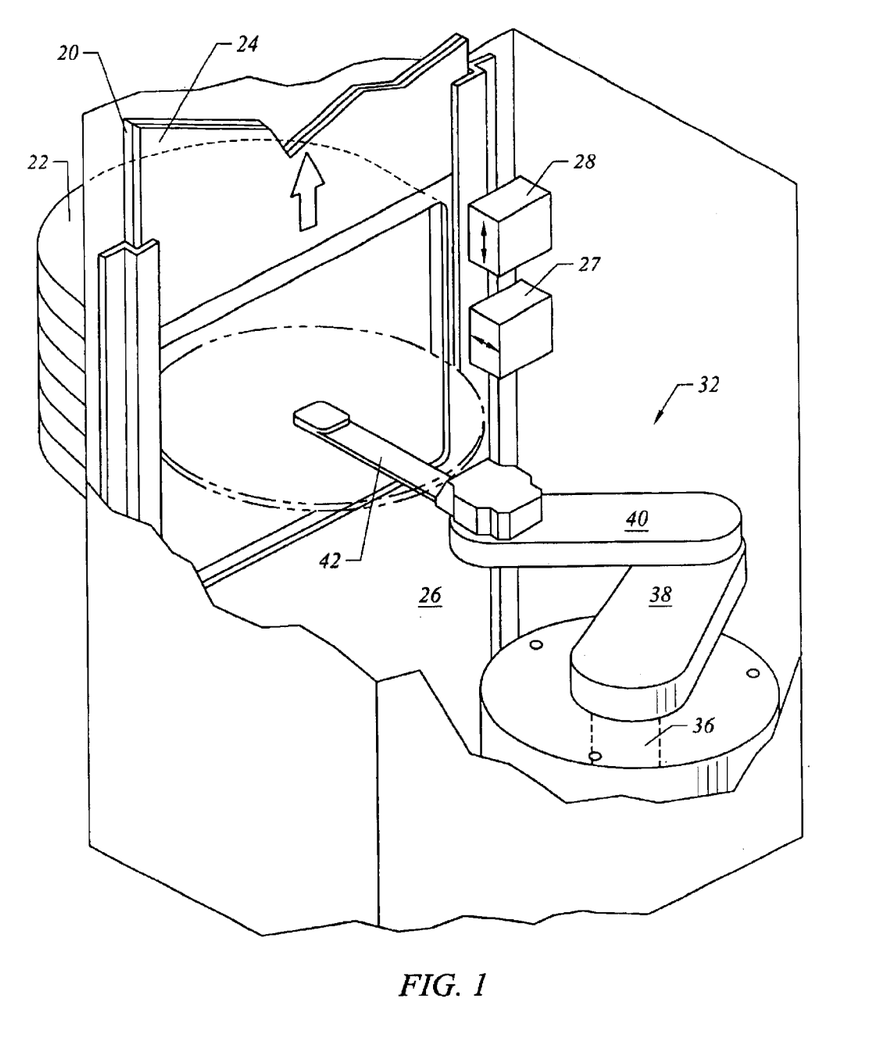
FIG. 1 is a rear perspective view of a conventional minienvironrent including a conventional wafer-handling robot for transferring wafers into a process tool.

As shown in FIG. 1, and as previously indicated, after the pod door 20 is separated from the pod cover 22, the pod door 20 and the port door 24 are moved in a first direction into a minienvironment 26 by a first transport 27, and then moved in a second direction out of the path of the incoming wafers by a second transport 28. The pod and port doors may be moved upward once located within the minienvironment as shown in FIG. 1. Alternatively, the minienvironment 26 may be configured to move the pod and port doors downward, or to the sides of the port. Transport mechanisms having two degrees of freedom are known for moving the pod and port doors in the two directions (i.e., into the minienvironment and then out of the path the wafers).

Typically, once the port and pod doors have been moved out of the wafer path, a wafer handling robot within the minienvironment transfers the wafers and/or wafer cassette from the SMIF pod into the minienvironment. Once in the minienvironment, the wafers are generally transferred directly into the process tool. Although there are various known robot configurations, one such wafer handling robot 32 for accessing and transferring wafers is shown in FIG. 1. The robot 32 includes a shaft 36 mounted for rotation and translation along a z-axis concentric with the shaft axis of rotation. The robot 32 further includes a first arm 38 affixed to an upper end of shaft 36 for rotation with the shaft, and a second arm 40 pivotally attached to the opposite end of the first arm 38. The wafer handling robot further includes an end effector 42 pivotally attached to the second arm 40. The robot 32 is controlled by a computer (not shown) such that end effector 42 slides into the wafer cassette underneath one of the wafers, rises up to support the wafer, and thereafter retracts from the cassette with the wafer supported thereon. Additionally, multiple end effectors are known which employ a plurality of tines for simultaneously removing a plurality of wafers from a cassette. Alternatively, the wafer handling robot may grip the entire cassette from the top, bottom or sides of the cassette to transfer an entire batch of wafers within the pod into the minienvironment.

Having to position the removed pod and port doors either above, below, or to the sides of the I/O port of the minienvironment presents several drawbacks. First, semiconductor process tools and I/O minienvironments typically include more than one port. Having to leave space adjacent the I/O ports for positioning the removed pod and port doors limits the configuration of the minienvironment with respect to where the I/O ports may be located. For example, in the minienvironment of FIG. 1, the second I/O port (not shown) could not be positioned above the shown I/O port, as room must be left at that location for storing the pod and port doors during processing of a wafer lot within the processing tool. Additionally, a mechanical transfer mechanism must be provided at the front interior of the minienvironment for pulling the removed port and pod doors into the minienvironment, and another mechanical transfer mechanism must be provided for next translating the pod and port doors away from the I/O port. These transfer mechanisms are cumbersome, taking up valuable space at the front interior of the minienvironment, and also add to the complexity of the design and software control of the minienvironment. Furthermore, these transfer mechanisms are a potential source of contamination within the minienvironment.

SUMMARY OF THE INVENTION

It is therefore an advantage of the present invention to provide a minienvironment wherein the removed port and pod doors may be located at any convenient location within the minienvironment.

It is a further advantage of the present invention to provide a minienvironment where conventional transport mechanisms for pulling the pod and port doors into the minienvironment, and for translating the pod and port doors away from the I/O port may be omitted.

It is another advantage of the present invention that the wafer handling robot also accomplishes removal and storage of the port and pod doors to allow transfer by the robot of the wafers through the I/O port.

It is a further advantage of the present invention to simplify and provide greater flexibility with regard to the design of the electrical power supply and signal transfer for controlling the transfer of the port door to and from the I/O port.

It is a still further advantage of the present invention to reduce the sources of potential contamination within the minienvironment.

These and other advantages of the present invention are provided by a system within an I/O minienvironment, the system engaging a port door from within an I/O port, removing the port door and pod door coupled thereto, and setting down the pod and port doors at a convenient location within the I/O minienvironment. After wafer processing has been completed and the wafers have been transferred back through the I/O port to the SMIF pod, the system may retrieve the port and pod doors, and return the port and pod doors to their sealing positions within the I/O port and pod, respectively.

In a preferred embodiment, the system for gripping and transporting the port and pod doors may be located on the back end of the end effector of the wafer handling robot within the I/O minienvironment. The back end of the end effector is the end of the end effector opposite that used to transport the wafers and/or cassette.

BRIEF DESCRIPTION OF THE DRAWINGS

The present invention will now be described with reference to the drawings, in which.

DETAILED DESCRIPTION

The present invention will now be described with reference to FIGS. 2–8B, which in general relate to a system within an I/O minienvironment for engaging, removing, and returning a port door and a pod door from an I/O port and a SMIF pod, respectively. While a preferred embodiment of the invention may operate with SMIF pods, it is understood that the type of pod utilized is not critical to the present invention, and any of various containers in which semiconductor wafers are housed may operate with the present invention. This includes, but is not limited to, front opening pods, bottom opening pods, cassetteless pods, and open cassettes in which the wafers are seated. Additionally, it is contemplated that the present invention may operate with workpieces other than semiconductor wafers, including reticles, flat panel displays, and other substrates which may be transferred from a storage container to within a processing tool.

Figure 2:
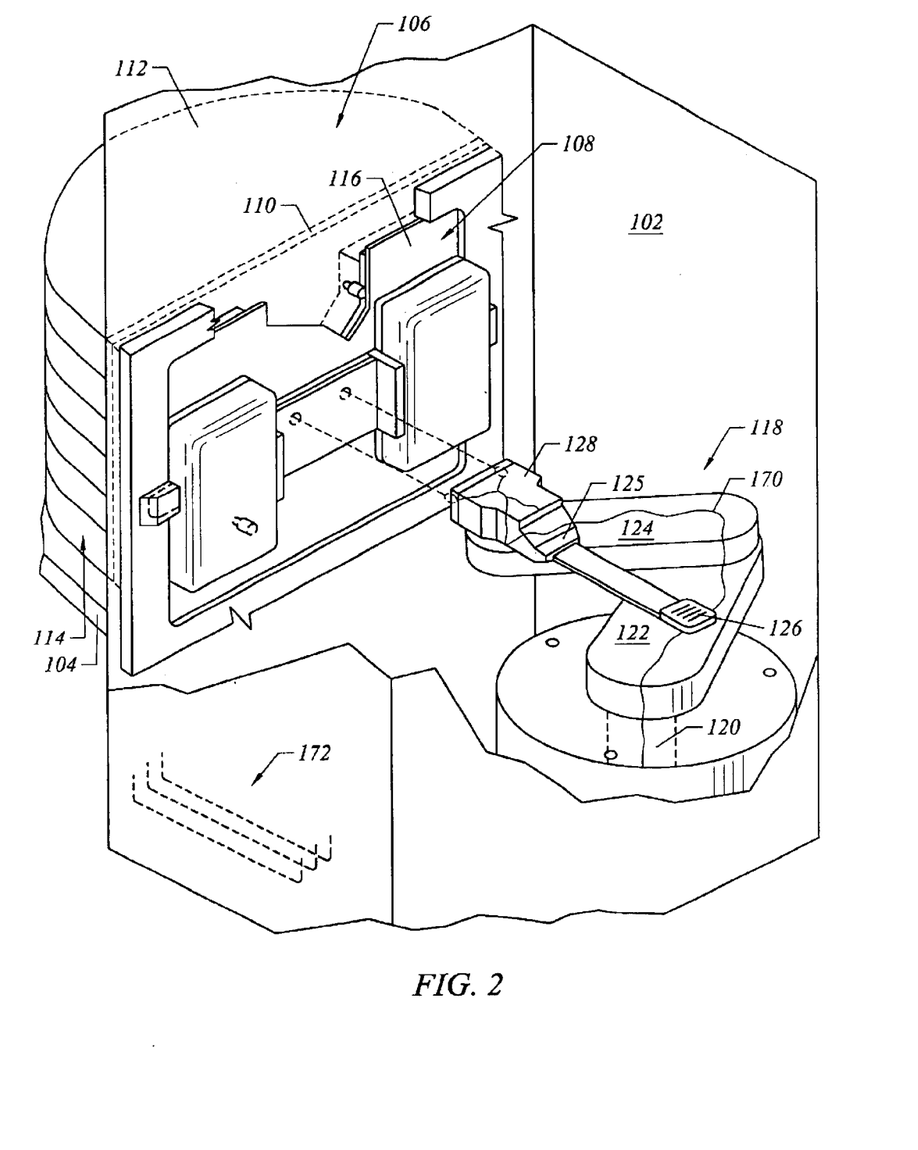
FIG. 2 is a rear perspective view of a minienvironment and a door-gripping and wafer-handling robot according to the present invention.

Referring now to FIG. 2, there is shown an I/O minienvironment 102 affixed to a front surface of a semiconductor processing tool (not shown). As shown, the minienvironment 102 includes a support surface 104 for supporting a SMIF pod 106 adjacent an I/O port 108 of the minienvironment. In the embodiment shown, SMIF pod 106 is a front opening pod, including a pod door 110 on a front vertical surface of the pod, and a pod cover 112 capable of mating with the pod door to provide a sealed, isolated environment for storing and transporting wafers located within the pod. As is known in the art, support surface 104 may include a plurality of kinematic pins 114 for mating with grooves on a bottom surface of the SMIF pod to allow fixed and highly repeatable positioning of a SMIF pod 106 adjacent the I/O port 108. In the absence of a pod 106 on the port 108, a port door 116 overlies the port in a preferred embodiment to prevent particulates from passing through the port into the minienvironment. As explained in greater detail below, when a pod is loaded adjacent the I/O port 108 for processing of the wafer contained therein, a robot 118 engages and removes the port door 116 from the I/O port 108, sets the door down within the minienvironment 102, and then returns to the port to access the wafers from within the pod.

The robot 118 includes a shaft 120 mounted for rotation and translation along a z-axis concentric with the shaft axis of rotation. A first arm 122 is affixed to an upper end of shaft 120 for rotation with the shaft, and a second arm is pivotally attached to an opposite end of the first arm 122. A double-sided end effector 125 is rotationally attached to an opposite end of the second arm 124. A first end of the double-sided end effector 125 includes a wafer access end 126 which may have a conventional configuration and mode of operation. A second end of the double-sided end effector opposite the first end may comprise a door gripping assembly 128. As explained hereinafter, in a preferred embodiment, the door gripping assembly powers the decoupling of the port and pod doors, mates with the port and pod doors, and moves the port and pod doors to and from the I/O port 108. The movement of the shaft, arms, and double-sided end effector are controlled to move three dimensionally within minienvironment 102 by a computer (not shown).

Figure 3A:
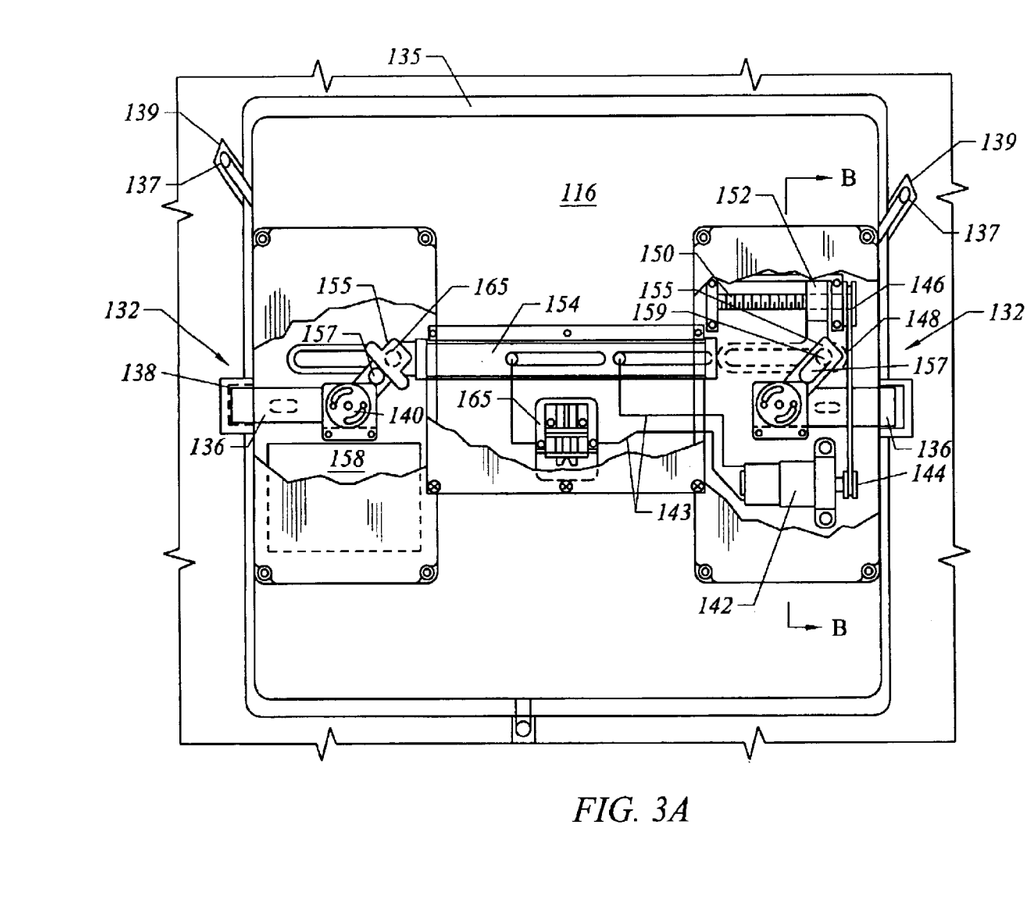
FIG. 3A is a cross-sectional rear view of a port door according to the present invention.
Figure 4A:
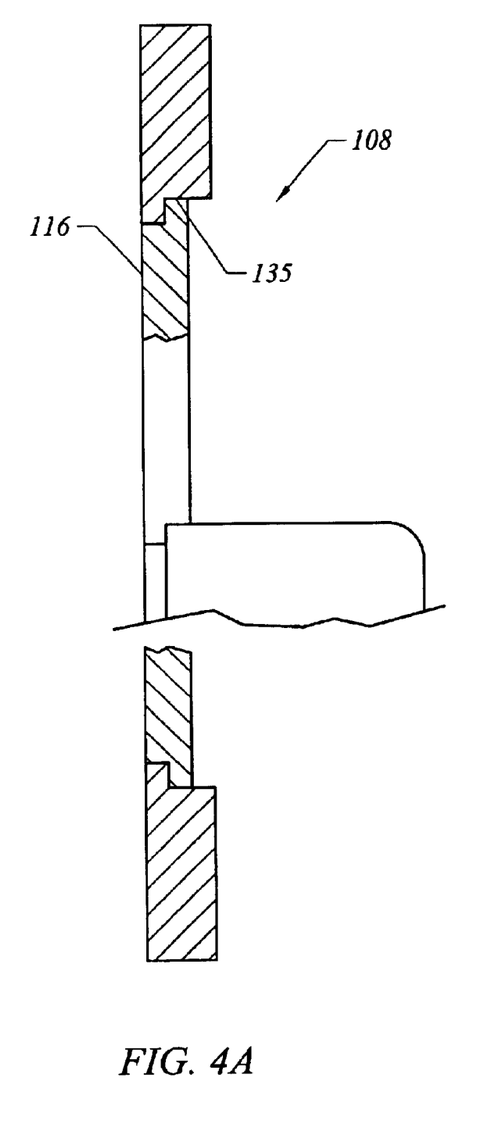
FIG. 4A is a cross-sectional end view of a port door fitting in a port plate according to the present invention.
Figure 4B:
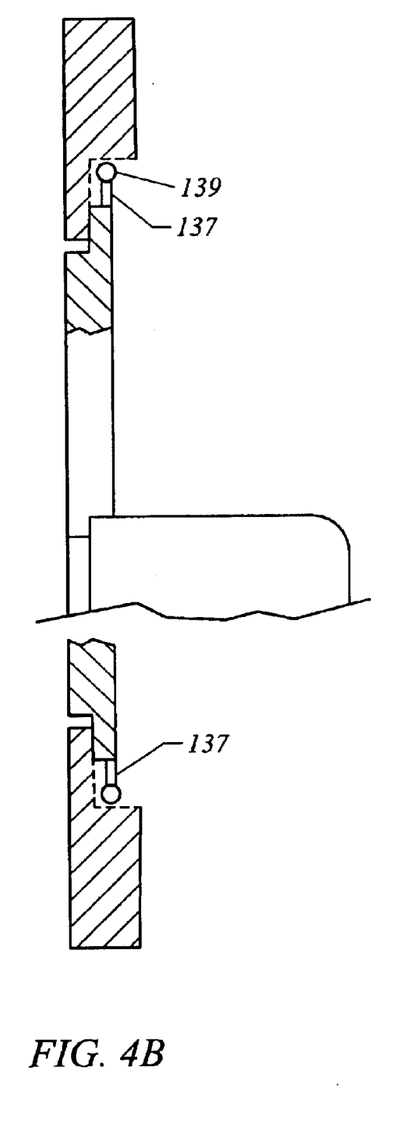
FIG. 4B is a cross-sectional end view of a port door fitting within a port plate according to an alternative embodiment.

As shown in FIGS. 4A and 4B, the I/O port includes a groove 135 around its periphery into which the outer circumference of the port door 116 fits. The port door may fit snugly within the groove 135 of the I/O port. Alternatively, as shown in FIGS. 3A and 4B, the port door may have a circumference that is slightly smaller than the space defined around the I/O port by the groove 135. In this instance, pins 137 may be provided on the port door to fit within slots 139 formed within the groove 135. The respective positions of the pins 137 and slots 139 on the port door 116 and groove 135 may be reversed in alternative embodiments of the invention. The pins and slots serve to define points of contact between the port door and the I/O port to properly position the door within the port.

Figure 3B:
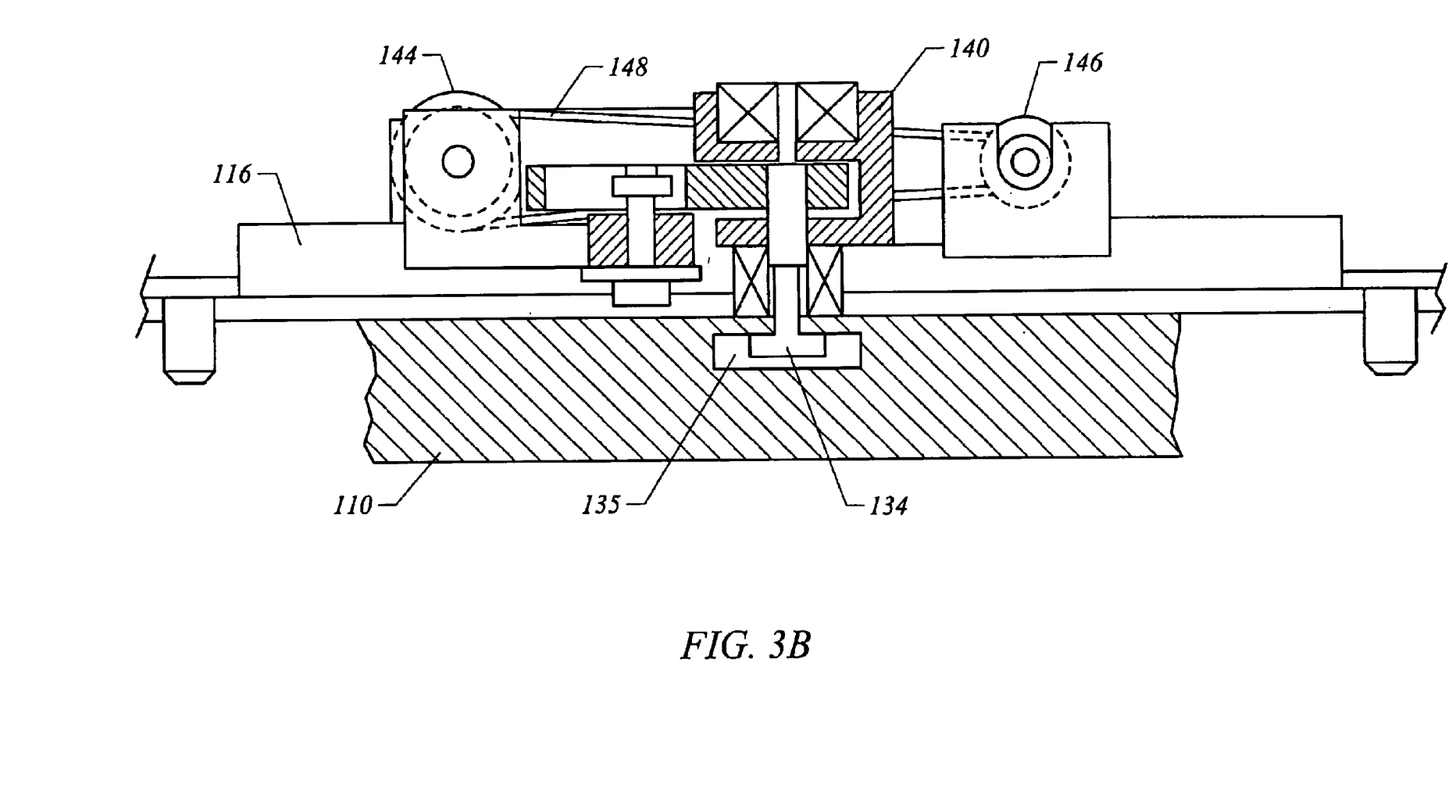
FIG. 3B is a cross-sectional view through line B—B on FIG. 3A.
Figure 5A:
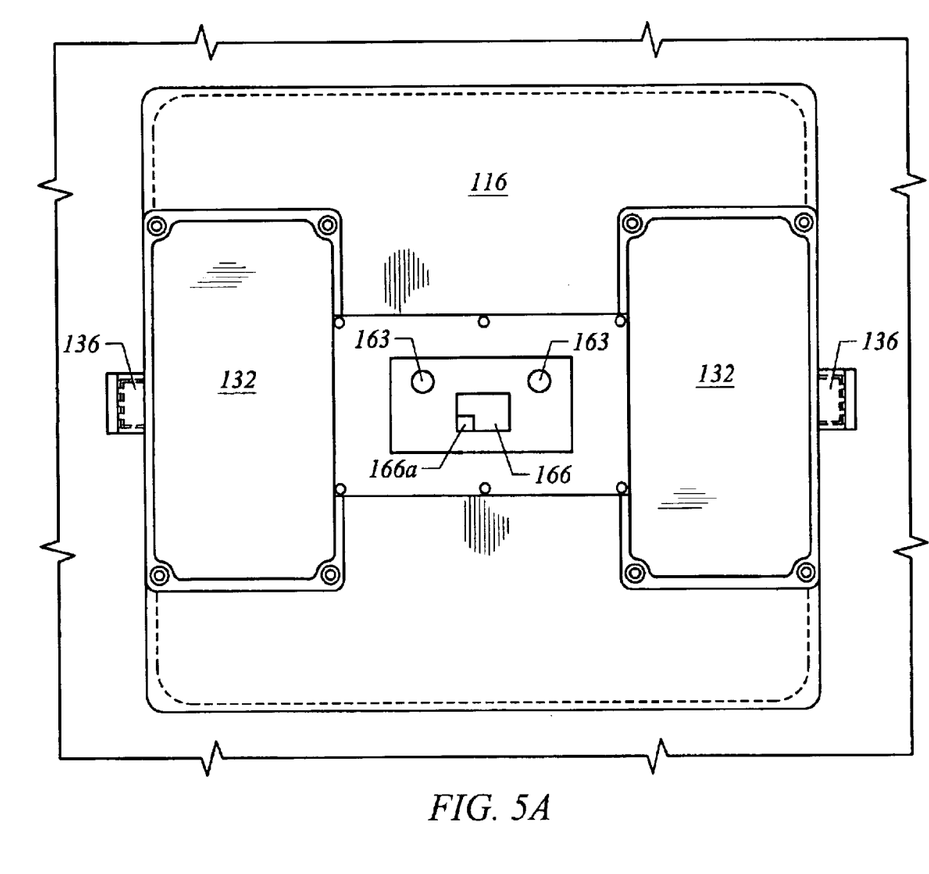
FIG. 5A is a rear view of a port door in an I/O port according to the present invention.

Referring now to FIGS. 3A, 3B and 5A, the present invention preferably includes a pair of door latch assemblies 132 for securing and removing the port door with respect to the I/O port, and for securing and removing the pod door with respect to the SMIF pod 106. In a preferred embodiment, there are two door latch assembly 132, each being structurally and operationally similar to each other. In a preferred embodiment, once a pod is seated adjacent a port door 116 (as indicated by a pod-at-port sensor explained hereinafter), the door latch assembly 132 may decouple the port door from the I/O port 108, unlatch the pod door 110 from the pod cover 112, couple the pod door 110 to the port door 116, and fasten the port door to the robot.

FIGS. 3A, 3B and 5A show a cross sectional interior rear view of the port door, a cross sectional side interior view through line B—B of FIG. 3A, and a back view of the port door, respectively. Each door latch assembly 132 on the port door 116 preferably includes a latch key 134 (FIG. 3B) which mates within grooves 135 within the pod door. Rotation of the latch keys 134 actuate decoupling mechanisms within the pod door to unlatch the pod door from the pod, and to affix the pod door to the port door. An example of a latching assembly for removably coupling a pod door to a SMIF pod is disclosed in U.S. Pat. No. 4,995,430, entitled "Sealable Transportable Container Having Improved Latch Mechanism", which Patent is assigned to the owner of the present application and which Patent is incorporated by reference herein in its entirety.

The latch keys 134 may be concentrically affixed to a pair of rotating hubs 140 (FIGS. 3A and 3B) in respective door latch assemblies in the interior of the port door. Rotation of the hubs in one direction unlatches the pod door from the pod cover, and latches the pod door to the port door. Conversely, rotation of the hubs in the opposite direction unlatches the pod door from the port door, and latches the pod door to the pod cover.

As best seen in FIGS. 2 and 3A, each door latch assembly 132 further includes a bolt 136 which removably fit within slots 138 in the I/O port. The bolts 136 may be translationally affixed to the hubs via various motion translation systems, such as for example a rack and pinion system (not shown). In such an embodiment, each hub may include a gear toothed pinion section mating with a rack formed within the respective bolts 136. In this embodiment, rotation of the hubs to unlatch the pod door from the pod also retracts the bolts 136 to decouple the port door from the I/O port. Conversely, rotation of the hubs to once again latch the pod door to the pod extends the bolts 136 to secure the port door within the I/O port.

The hubs 140 are rotated by a motor 142 mounted within the port door in a preferred embodiment. Motor 142 may be an electrical motor which preferably receives current via wires 143 from the door gripping assembly as explained hereinafter. Various mechanisms and linkages may be used to transfer torque from the motor to the hubs to thereby rotate the hubs. However, in a preferred embodiment, the motor 142 drives first and second pulleys 144, 146 attached to each other by a timing belt 148. The second pulley 146 is attached to a lead screw 150 having a carriage 152 mounted thereon which moves back and forth along the lead screw upon the screw's rotation. The carriage 152 is in turn affixed to a translating rod 154 provided along the length of the interior of the port door. The translating rod 154 is in turn affixed at its ends to a pair of slotted arms 155 extending from respective hubs 140. Slotted arms 155 include slots 157 in which a follower 159 on rod 154 rides. As the rod 154 translates, the follower 159 rotates the arms 155, which arms in turn rotate the hubs 140.

Various configurations of optical sensors may be provided for sensing rotation of the hubs and/or translation of the rod indicate when sufficient rotation of the hubs has taken place. The port door may further include control circuitry 158 for controlling the speed of motor 142 and for receiving feedback from the sensors monitoring rotation of the hubs 140 and/or translation of rod 154.

In a preferred embodiment, the hubs and bolts of the present invention operate similarly to the cam mechanism and latch plates, respectively, of U.S. Pat. No. 4,995,430 to provide a two-stage movement of the bolts. The details of such two-stage movement are described in U.S. Pat. No. 4,995,430 at least at column 6, line 4 to column 9, line 29. However, in general, the two stage movement to latch the bolts in the slots 138 involves first translating bolts laterally to locate them in slots 138, and second pivoting the bolts out of their plane of translation. The pivoting of the bolts 136 in their slots 138 serves to pull the port door tightly into the I/O port 108. It is understood that the components disclosed in U.S. Pat. No. 4,995,430 in addition to the cam mechanism and latch plates to accomplish the two stage motion are also preferably included in the port door 116 of the present invention.

Figure 8A:
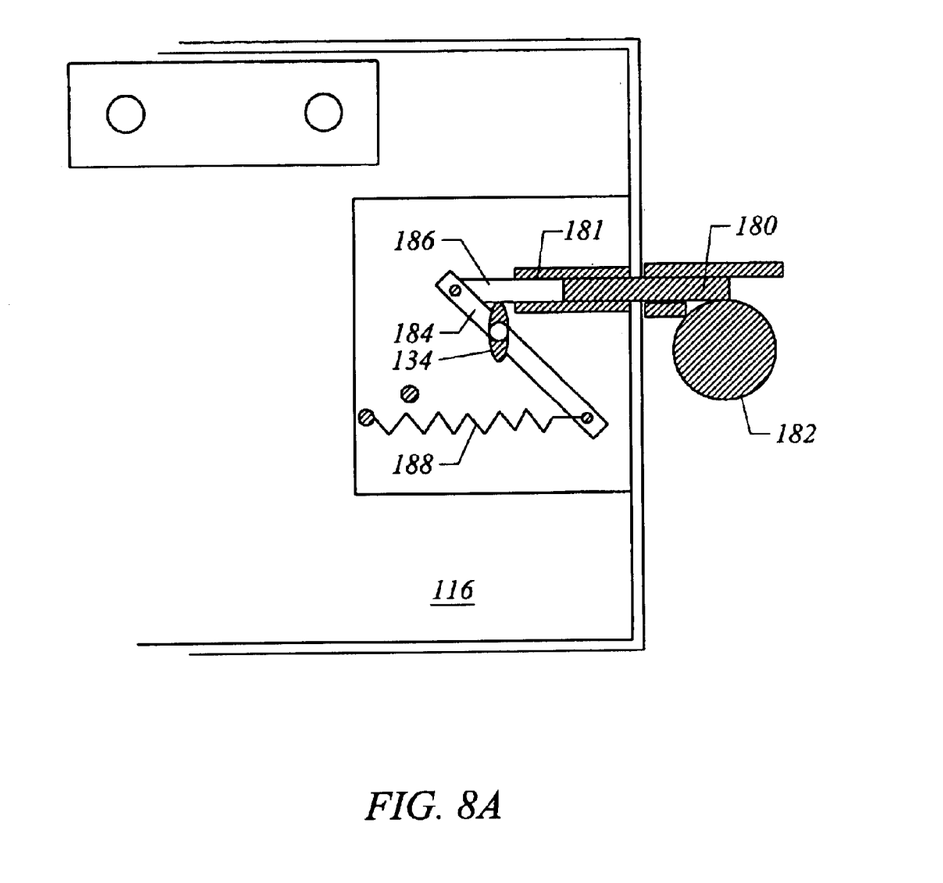
FIGS. 8A and 8B show a partial rear view of a port door including a first and second position, respectively, of a door latch assembly according to an alternative embodiment of the present invention.
Figure 8B:
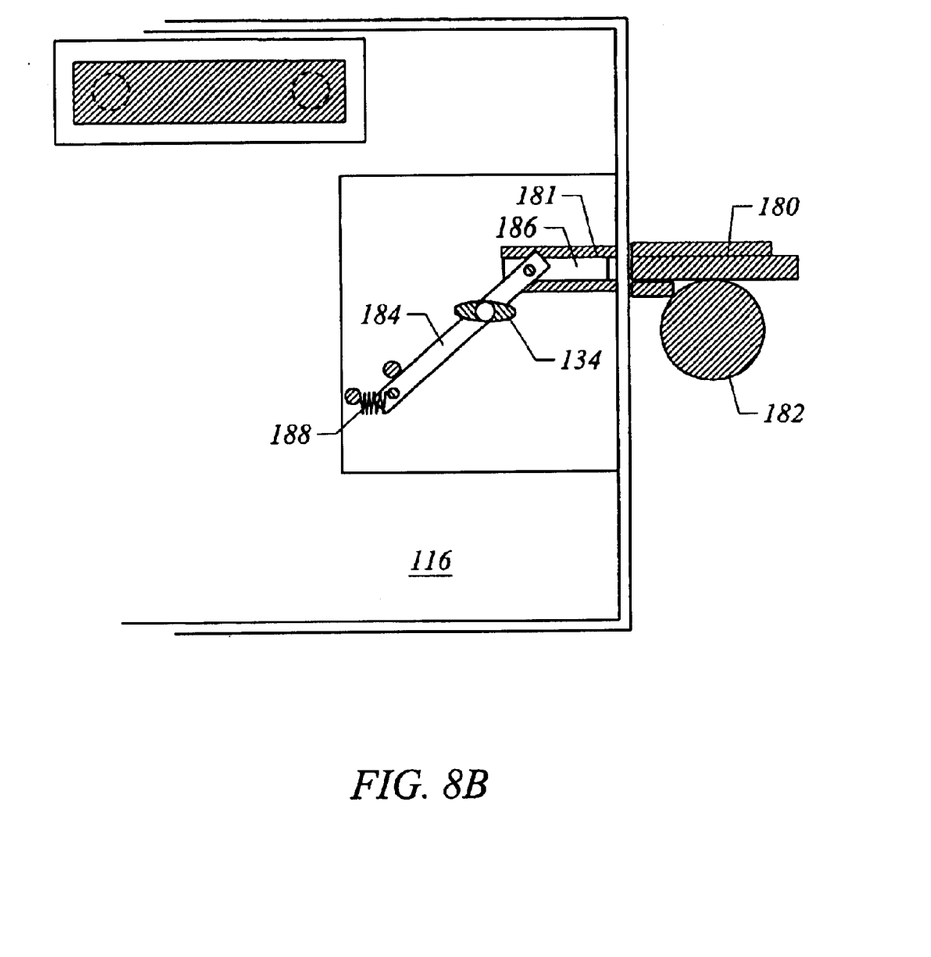

In an alternative embodiment of the present invention, the mechanisms for affixing the port door within the I/O port may be separated from the mechanisms for decoupling the pod door and attaching the pod door to the port door. FIGS. 8A and 8B show an example of a door latch assembly 132 according to such an embodiment. Although one door latch assembly 132 is shown in FIGS. 8A and 8B, it is understood that another such assembly is preferably provided on the other side of the port door 116. FIG. 8A shows a bolt 180 in the port plate having an end portion removably situated within a slot 181 in the port door 116. An actuator 182 is capable of rotating the bolt 180 into and out of the slot 181. Motor 142, described above, may be located in the port plate in this embodiment for rotating actuator 182. The port door includes a lever 184 attached to a bolt-following member 186 at a first end, and a spring 188 at a second end. In this embodiment, the latch key 134 as described above for coupling/decoupling the pod door from the pod is mounted to the lever 184 at an axis of rotation of the lever.

Spring 188 biases the bolt-following member 186 against the bolt 180 via lever 184. As shown in FIG. 8B, when the actuator 182 removes the bolt 180 from the slot 181, the bolt-following member 186 follows the bolt as a result of the tension in spring 188. The translation of member 186 will rotate lever 184, thereby rotating latch key 134 to decouple the pod door from the pod and latch the pod door to the port door. To once again couple the port door to the I/O port and the pod door to the pod, the actuator 182 is rotated in the opposite direction to move the bolt 180 back into the slot 181. The bolt in turn moves the bolt-following member, which rotates the lever 188 and latch key 134, and also once again loads spring 188.

Those of skill in the art will appreciate that any of various systems may be substituted for that described above for actuating rotation of the latch keys 134 and translation of the bolts 136 or 180. In one such alternative embodiment, the door-to-robot mating mechanism (explained hereinafter) would include a latch key similar to latch key 134 to activate decoupling mechanisms in the port door and pod door. Additionally, instead of translating bolts 136 or 180 into and out of the bolt-receiving slots, it is understood that the bolts 136 or 180 may be configured to rotate into and out of the slots.

Figure 5B:
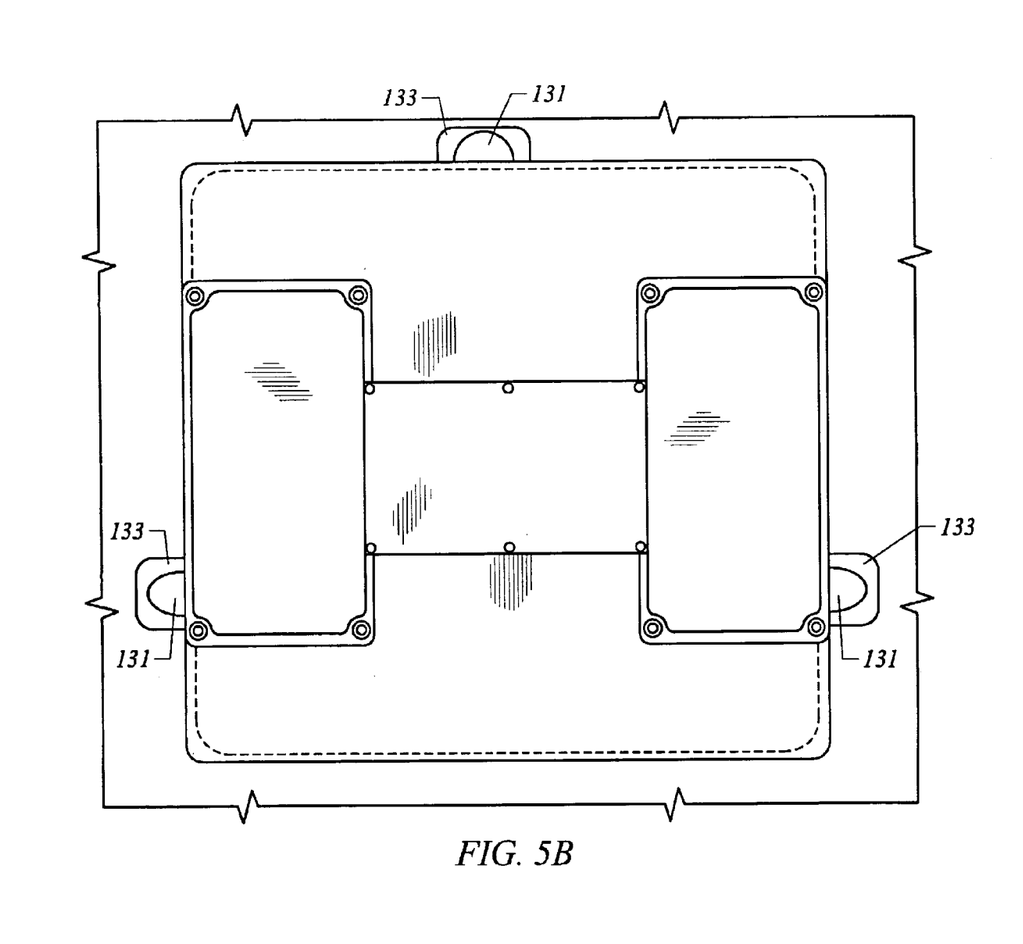
FIG. 5B is a rear view of a port door in an I/O port according to an alternative embodiment of the present invention.

In a still further embodiment of the invention shown in FIG. 5B, the bolts may be omitted. In this embodiment, the port door 116 is held within the I/O port 108 by two or more electromagnets 131 extending from the sides of the door 116, which electromagnets 131 contact magnetically permeable plates 133 around the I/O port 108 when the port door is held within the I/O port. The relative positions of the electromagnets 131 and plates 133 may alternatively be reversed so that the electromagnets are mounted around the I/O port and the magnetically permeable plates 133 extend from the port door.

Whether located on the port door or around the I/O port, the electromagnets of this embodiment preferably operate in conjunction with permanent magnets to hold the door in the port. In one embodiment, a permanent magnet and a permeable plate (which may be the same or different than plates 133) are located on the port door and port plate to provide a permanent attraction between the port door and port plate. When the port door is to be removed from the I/O port, current is suppled to the electromagnet which is set up to repel the permeable plate 131, and overcome the force of the permanent magnet. In this embodiment, the door gripping assembly (explained below) is in contact with the port door before current is supplied to the electromagnet. In an alternative embodiment, the permanent magnet and plate again provide a constant attraction between the port door and plate. Upon receipt of a current, the electromagnet augments the attraction of the permanent magnet to securely hold the port door in the port plate. When the door gripping assembly is to remove the port door, current to the electromagnet is shut off, and the door gripping assembly removes the port door from the port, overcoming the attractive force of the permanent magnet. The permanent magnet serves to hold the port door in the port in the event of a power outage. However, in embodiments where the electromagnet attracts the port door to the port, the permanent magnet may be omitted in alternative embodiments of the invention. The current to the electromagnets in either of the above embodiments is turned on (where the electromagnet repels the permeable plate) and is turned off (where the electromagnet attracts the permeable plate) at substantially the same time that the hub is rotated to decouple the pod door from the pod and attach it to the port door.

Referring now to FIGS. 2, 5B, 6A and 6B, the door gripping assembly 128 of the robot 118 includes a door-to-robot mating mechanism 160, support pins 161, a power couple 162, and a sensor system 164. Once a SMEF pod 106 is properly located near the I/O port 108 of a minienvironment 102, robot 118 may be activated to move the door gripping assembly 128 into engagement with the port door, on a side of the port door opposite the pod. In particular, a pod is initially loaded on a platform adjacent an I/O port on a minienvironment. At this point, a pod-in-place signal is generated by sensors in the I/O port and forwarded to the control computer to indicate the presence of a pod. Thereafter, the pod is advanced to the I/O port. Once the pod is located adjacent the I/O port, a pod-at-port signal is generated by sensors in the port and forwarded to the control computer to indicate location of the pod at the port. The control computer could use either the pod-in-place signal or the pod-at-port signal to initiate movement of the robot within the minienvironment to engage the port door and begin the decoupling sequence. Thus, the port door may be removed from the I/O port as soon as the pod is properly located at the port. As shown in FIG. 3A, the port door may further include a pod-at-port switch 165. The switch 165 prevents the door latching assemblies 132 from decoupling the port door from the I/O port in the event the pod is not yet situated at the port. Unless the control computer activates the pod-at-port switch 165, the switch prevents current from being transferred through wires 143 to the motor 142.

It is understood that the door-to-robot mating mechanism 160 may operate according to various coupling principles. However, in general, the mating mechanism 160 mates with a contact plate 166 on the port door, and support pins 161 are received within support holes 163 (FIGS. 5B, 6A and 6B) on the port door, so that the robot may grip and remove the port and pod doors from the I/O port and carry them into the minienvironment 102.

Figure 6A:
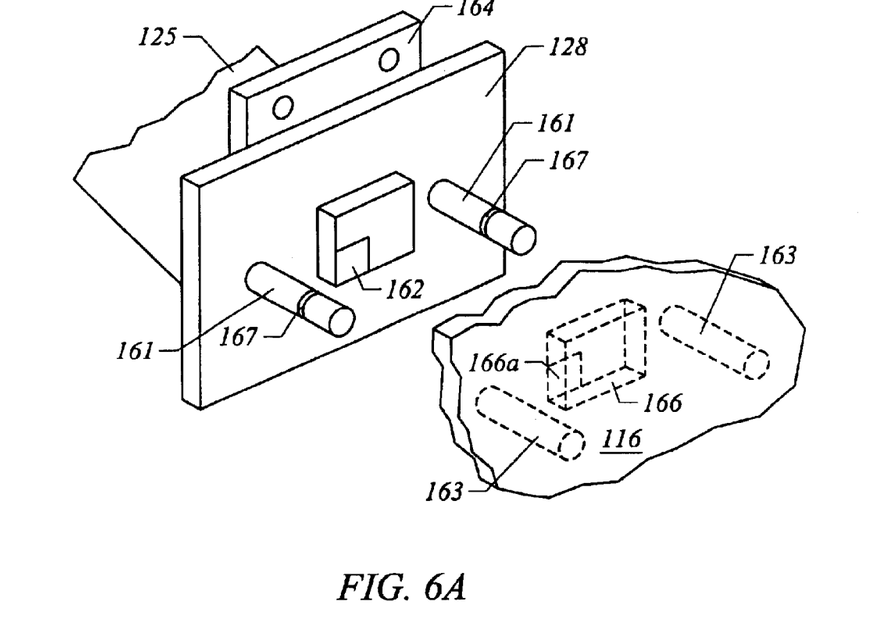
FIG. 6A is a perspective view of the robot-to-door mating mechanism according to the present invention.
Figure 6B:
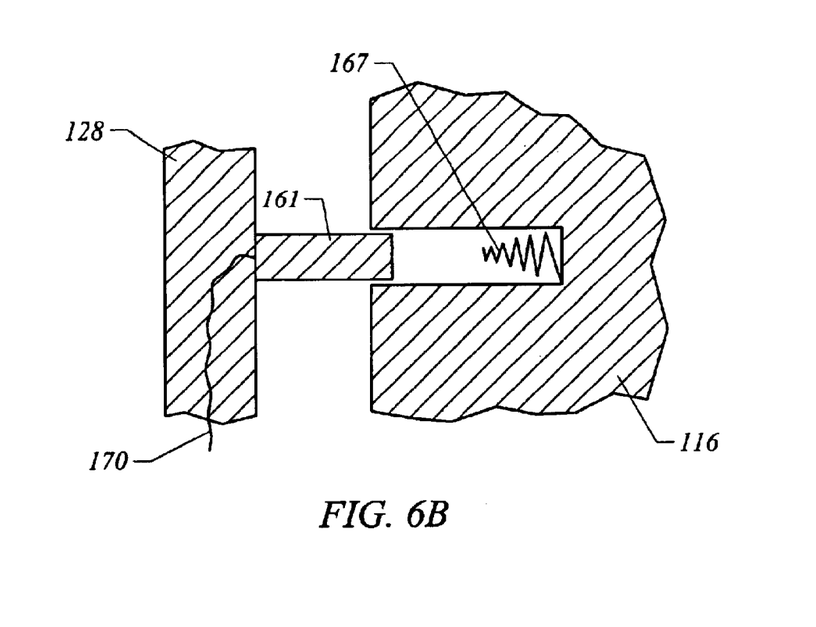
FIG. 6B is a side cross-sectional view of a support pin on the robot for supporting the port door on the robot.

In a preferred embodiment, the support pins may include notches 167. As described above, the bar 154 translates laterally to decouple the pod door from the pod, and the port door from the port. The bar 154 includes slots 169 through which the support pins on the robot are received. When the bar translates completely laterally, the ends 169a of the slots 169 engage within notches 167 in the support pins. Thus, the support pins are locked in the support holes 163 by the engagement of slot ends 169a in the notches 167 to thereby secure the port door on the robot.

It is understood that an alternative male-female configuration may be used on the door-to-robot mating mechanism and port door to hold the port door on the robot. In such embodiments, the male-configurd members may alternatively comprise latch keys, such as latch keys 134 described above. Here, the latch keys are inserted into the female-configured members on the port door and rotated to secure the port door on the robot gripping assembly, while also unlatching the pod door from the pod and latching it to the port door.

Instead of or in addition to the above described embodiments of the door-to-robot mating mechanism, mating mechanism 160 may comprise an electromagnet which mates with a magnetically permeable contact plate 166 on the port door. Upon engagement of the electromagnetic mating mechanism 160 and the contact plate 166, current may be supplied to the electromagnet so that the door gripping assembly will attract and hold the port door to allow the robot 118 to carry the port door and pod door into the minienvironment. The electromagnetic mating mechanism 160 and plate 166 operate with the electromagnets 131 and plates 133 used to hold the port door in the I/O port in such a way that when the electromagnetic mating mechanism 160 contacts the plate 166 and receives a current, current to the electromagnets 131 is turned on (where the electromagnet 131 repels the permeable plate), and is turned off (where the electromagnet 131 attracts the permeable plate). Similarly, when a port door 116 is returned to the I/O port by the robot 118 and current to the mechanism electromagnet 160 is turned off, current to the electromagnets 131 is switched on or off to again hold the port door in the I/O port. As explained hereinafter, wires may be provided through the robot for supplying current to the electromagnetic mating mechanism 160.

As a further alternative or addition, the mating mechanism 160 may utilize a partial vacuum coupling. In this embodiment, a conduit (not shown) may be provided through the robot 118, having one end terminating at the mating mechanism 160, and the other end attached to a low pressure source (not shown). Upon mating of the mechanism 160 with the contact plate 166, a partial vacuum may be set up that allows the robot to carry the port door and pod door into the minienvironment. The vacuum source could additionally maintain the pod door on the port door.

As would be clear upon a review of the present disclosure, this invention provides a simplified system for moving and storing the port and pod doors within the minienvironment away from the travel path of the wafers. By transporting the port and pod doors by the wafer handling robot, the transport mechanisms formerly necessary to first move the joined pod and port doors into the minienvironment, and to next move the pod and port doors away from the I/O port, may be omitted. In addition to simplifying the design of conventional minienvironments, the present invention vastly increases the flexibility of the minienvironment design by allowing the pod and port doors to be stored within the minienvironment at any desired location (preferably out of the path of any moving components). Thus, the I/O ports and other components within the minienvironment may be located as desired without having to reserve a particular location for storage of the pod and port doors.

The system for powering the door latch assemblies 132 will now be described with reference to FIGS. 2, 3A, 6A and 6B. In a preferred embodiment, robot 118 is fit with one or more electrically conductive wires 170 through the shaft 120 along arms 122, 124 and terminating at the power couple 162. The opposite end of the wires 170 may be connected to a remote current source. The power couple 162 preferably includes an electrically conductive surface capable of mating with an electrically conductive surface 166a on the contact plate 166. Upon contact between the door-to-robot mating mechanism 160 and the contact plate 166, current is transferred between the power couple and contact plate to thereby provide power and control signals to motor 142 and/or other components of the door latch assembly. Additionally, the electrical coupling of the robot to the port door allows feedback signals to be transferred from the control circuitry and pod-at-port sensor on the port doors to the control computer. As explained below, the door latch assemblies may additionally receive power from a source (not shown) in the port plate surrounding the I/O port. Thus, the port door may receive current when not engaged with the robot 118. This current may be used to power the electromagnets 131 securing the port door in the I/O port.

In an alternative embodiment of the present invention shown in FIG. 6B, the support pins 161 and the power couple 162 may be combined so that power is transferred to the port door through the support pins. In this embodiment, the support pins are electrically conductive, and are connected to a current source at their base. The support holes 163 each preferably include an electrically conductive spring 167 at their base. The spring is in turn connected via wires 143 (FIG. 3A) to electrical components in the port door. As the door gripping assembly 128 moves toward the port door, the support pins 161 engage and compress the spring 167. Thus, upon engagement of the robot with the port door, an electrically conductive path is established through the robot between the remote current source and the electrical components in the port door.

It is a feature of the present invention that the minienvironment may operate with relatively simple controls in comparison to conventional systems. Conventional minienvironments require hardware and software to control the operation of the robot and each of the transfer mechanisms for moving the one or more port doors. However, according to the present invention, upon receipt of the pod-at-port signal from the pod-at-port sensor, the computer need only control operation of the robot. The port door includes its own control circuitry, which preferably is powered by a dedicated power supply, such as a permanent or rechargeable battery, in the port door. This dedicated power supply provides a constant low voltage to the control circuitry so that the circuitry need not reboot at each door removal. In an alternative embodiment, the control circuitry may instead receive its power from the power couple on the robot or from the a power source in the port plate. Although the port door may preferably include its own control circuitry, control signals from the computer may also be passed to the port door through either the robot or the port plate in alternative embodiments of the invention.

As previously explained, a power source may be located within the port plate surrounding the I/O port instead of or in addition to the power from the power couple of the robot. In embodiments where the motor is located in the port plate, the power source for the motor may be located in the port plate. Similarly, the port plate power supply may be used to energize the door latching electromagnets 131. Wires run through the port plate may be used to carry the current from the port plate power supply to the electromagnets and motor. In embodiments where the motor is powered by a port plate power supply, the wires 170 through the robot may be used to carry a signal, generated upon contact of the door gripping assembly with the port door, to the control computer. Upon receipt of this signal, the control computer may switch the current to the electromagnets 131 on or off, and may initiate current flow to the motor. Alternatively, various optical, mechanical and/or RF sensors may be used to indicate contact of the door gripping assembly 128 with the port door, which sensors cause a signal to be sent to the computer to turn the current to the electromagnets 131 on or off, and to run the motor.

As described above, when located in the port door, the motor 142 preferably receives current from wires within the robot 118, and when located in the port plate, the motor 142 preferably receives current through wires in the wall of the minienvironment. However, it is contemplated that the motor 142 receive current from wires in the wall of the minieviromnent and/or wires through the robot 118 whether located within the port door or the port plate. Similarly, the electromagnets 131 may receive current from wires in the wall of the minienvironment and/or wires through the robot 118 whether located within the port door or the port plate. The port door and port plate may include conductive contacts which engage each other when the port door is in the I/O port, for carrying current between the port door and port plate.

It is further contemplated that a rechargeable power source, such as for example a lithium battery, may be located within the port door, which rechargeable battery is charged from a power source (not shown). The power source for charging the battery may be located on the robot arm, at the storage shelves 172 (explained below), or in the port plate. When the door gripping assembly comes into contact with the port door, the rechargeable battery may be used to supply power to the motor 142. The rechargeable battery may also be used to power the electromagnets 131.

Once a SMIF pod 106 is located on an I/O port 108, and the door gripping assembly has removed the port and pod doors from the I/O port, the present invention provides a great deal of flexibility with regard to where the port and pod doors may be set down within the I/O minienvironment 102. In the embodiment shown in FIG. 2, the joined port and pod doors may be set down by the door gripping assembly in one of a plurality of shelves 172. Once robot 118 has positioned the port and pod doors with a particular shelf 172, the door-to-robot mating mechanism may release the pod and port doors, and then the robot may process the wafers within the opened pod with the wafer/cassette-handling end of the double-sided end effector 125. Where the mating mechanism 160 comprises an electromagnet, the computer may turn off the current to the magnet to release the pod and port doors. Where the mating mechanism 160 comprises a partial vacuum, the computer may vent the low pressure source to release the pod and port doors. And where the mating mechanism 160 comprises a male/female configuration, the computer may manipulate the robot to release the pod and port doors.

As shown, the shelves may be located to the side of the minieniromnent 102 away from the space within the minienvironment used by the robot 118 to transport the wafers and/or wafer cassettes. It is understood that the shelves 172 for supporting the port and pod doors may be located at various locations on the floor and/or side walls of the minienvironment. In embodiments of the minienvironment including more than one I/O port, it is conceivable that more than one set of pod and port doors may be removed from their respective ports and stored in the shelves 172. In such embodiments, the pod and port doors are preferably stored in the shelves from the back shelves forward, and removed from the shelves front to back, with front shelves being defined as those closest to the robot 118. Other storage and removal sequences are contemplated. Instead of being stacked with respect to each other, it is contemplated that shelves 172 be located side-by-side, or above and below, each other in alternative embodiments.

In a further embodiment, one or more storage locations (not shown) may be provided in the minienvironment which are configured to look like the I/O port 108 utilized in that minienvironment. For example, where a port plate includes magnetically permeable plates 133 for receiving electromagnets 131, and a groove 135 and stots 139 for receiving pins 137, as shown in FIGS. 4A and 4B, the same mechanisms may be used in the storage location within the minienvironment. Thus, the robot 118 may remove a pod and port door from an I/O port, and set it down within the storage location, where it is held by the same mechanisms used to hold the port door within the I/O port. The position of the robot is known by the control computer as it moves around the minienvironment. Thus, the control computer knows whether the robot is locating a port and pod door at a storage location, or whether the robot is locating a port and pod door back within an I/O port.

After wafer processing has been completed, in a preferred embodiment, the door gripping assembly once again engages the pod and port doors, lifts them from their shelves or storage locations within the minienvironment, and returns them to the I/O port. Once returned to the I/O port, current to the electromagnets 131 is resumed, and the hubs 140 are rotated in the opposite direction than for removing the port and pod doors, to once again lock the port door in the I/O port, and to return the pod door to the pod.

In a further embodiment of the present invention including a minienvironment 102 having two I/O ports 108, it is contemplated that the minienvironment operate with a single port door which is shuffled between the two I/O ports. It is typical for a pod at the first I/O port to be removed and replaced by another pod while processing of the wafers at the second I/O port is taking place. Therefore, in this embodiment, operation could initially start with port doors in both I/O ports. Once a pod is located at one of the ports, the door gripping assembly removes the pod and port doors at that port as described above. That first pod and port door may be located within a shelf 172 somewhere within the minienvironment 102. Once processing of the wafers of that first pod has been completed, and a second pod has been located at the second port, the door gripping assembly 128 may remove the port and pod doors at the second port and transfer them to the first port. Here, the pod door of the pod on the second port is moved to the pod on the first port. Thereafter, processing of the wafers in the pod on the second port may be carried out while the pod on the first port is removed and replaced by another pod. This process may be repeated for all subsequent pods, until a final pod is processed. After processing on the final pod is completed, the port and pod doors initially stored in the shelves 172 is picked up by the door gripping assembly and moved to the port of the last processed pod.

In an alternative embodiment of the present invention, the door gripping assembly 128 need not set the pod and port doors down once the door gripping assembly 128 has removed the doors from the port. Wafer processing by the robot 118 may occur with the pod and port doors held on the door gripping assembly 128 of the robot arm. Such an embodiment may be preferable where the wafer access end 126 of the double-sided end effector 125 comprises a multi-tine end effector for accessing multiple wafers from within a wafer cassette simultaneously. In such an embodiment, the port and pod doors on the opposite end of the double-sided end effector could act as a counterweight to balance the weight on both sides of the double-sided end effector.

In embodiments where the port and pod doors remain on the robot while the robot access the wafers, it is contemplated that the door gripping assembly 128 may operate as above, or alternatively, could be permanently affixed to the port door. In this latter embodiment, the various coupling systems described above for removably coupling the door gripping assembly to the port door may be omitted in lieu of a permanent attachment means between the door gripping assembly and the port door. Alternatively, the door gripping assembly of the robot and the port door could be separate in this embodiment, and include one of the above-described embodiments of the door-to-robot mating mechanism 160.

Up to this point, the robot 118 has been described as including a double-sided end effector 125, with one side including a door-to-robot mating mechanism 160 and the other side including a wafer access end 126. However, in alternative embodiments of the present invention, it is contemplated that the robot include two independent arms, with one arm including a door-to-robot mating mechanism and the other arm including a wafer access end effector. In such an embodiment, the arm used to grip and move the port and pod doors could set the doors down at the shelves 172 as described above, or may retain the doors on the mating mechanism at the end of the arm, while the second arm accesses the wafers within the pod.

It is understood that the present invention as described above may be adapted to operate with bottom opening pods. In such embodiments, the SMIF pod would be supported at a horizontally oriented I/O port on a port door. The robot would then engage the port door as described above, decouple the port door from the I/O port, decouple the pod door from the pod, and couple the pod door to the port door. Thereafter, instead of moving the pod and port doors away, the robot would lower the wafers and/or wafer cassette while leaving them supported on the port and pod doors. The robot would set the port and pod doors down on a kinematic mount platform, withdraw from underneath the port door, and then access the wafers with the opposite end of the double-sided end effector. In this embodiment, the elevators conventionally used for lowering the port door, pod door and wafers may be omitted.

The minienvironment 102 according to the present invention has thus far been described as including port doors. However, in a further embodiment of the present invention shown in FIG. 7, the port doors from the one or more I/O ports in the minienvironment could be omitted. Here, the I/O minienvironment 102 could be provided with a supply of gas so that there is a positive pressure and fluid flow out of the minienvironment through the I/O ports. This flow would substantially prevent particulates from entering into the minienvironment. Alternatively, the gas could be expelled from vents adjacent to the I/O ports, in a direction parallel to the ports so as to form a gas curtain 175 over the ports. Once a pod is located adjacent a particular I/O port, the gas flow through or over that port may be shut down. It is alternatively contemplated that the gas flow through or over a port continue while a pod is positioned adjacent thereto.

Figure 7:
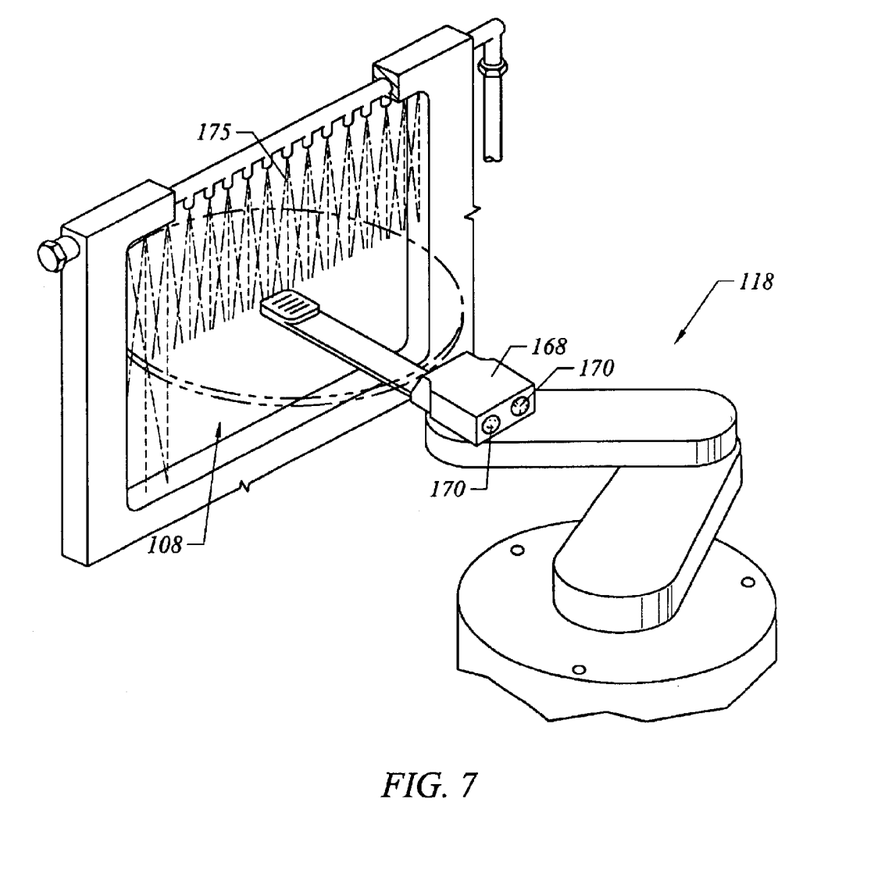
FIG. 7 is a rear perspective view of a minienvironment according to an alternative embodiment of the present invention.

In the embodiment shown in FIG. 7, the robot 118 may include a door gripping assembly 168 including a pair of latch keys 170 of the same configuration and in the same relative position as latch keys 134 described above on port door 116. In this embodiment, once a pod is located at a particular I/O port, the door gripping assembly 168 engages directly with the pod door, and the latch keys 170 decouple and remove the pod door from the SMIF pod. Thereafter, the pod door may be carried away from the port by the robot and be set down at any of various locations within the minienvironment. Alternatively, the pod door may remain engaged with the door gripping assembly 168 as the end effector on the opposite end of the robot arm processes the wafers within the pod.

In a further embodiment of the present invention, the door gripping assembly 128 of FIGS. 2–6B, or the door gripping assembly 168 of FIG. 7, may include sensors for wafer mapping and/or identification. Such sensors are known in the art. In one embodiment, the sensors may comprise a laser which is positioned on the wafer gripper such that when the wafer gripper is carrying the port and pod doors, the laser can "see" over the doors and into the pod. By vertical translation of the gripping assembly by the robot 118, the sensor can map each position of the wafers within a cassette.

Additionally, or alternatively, the door gripping assembly may include a wafer identifier, such as for example a CCD camera, which is positioned on the gripping assembly to see into the cassette when the gripper removes the port and pod doors, to thereby identify and/or read other indicial marks located on the wafers. It is understood that a sensor may be provided on the gripping assembly to sense other positional and/or identification information regarding the wafers.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A system for transferring wafers into and out of a SMIF pod having a pod door releasably coupled to a pod shell, comprising:
 a processing tool having an interior region, including:
  an I/O port for allowing wafers to pass between the, SMIF pod and said interior region; and
  a port door releasably secured to said I/O port, said port door having a first and second side, said second side having a pair of latch keys for coupling/decoupling the pod door and the pod shell and for coupling/decoupling said port door with the pod door; and
 a robot having an end effector, said end effector including:
  a wafer access device for transferring wafers between the SMIF pod and said processing tool; and
  a port door gripping assembly for releasably securing said end effector to said first side of said port door so that said robot may transfer said port door between said I/O port and a predetermined position within the processing tool.

2. The system according to claim 1, wherein said port door forms a seal with said I/O port.

3. The system according to claim 1, wherein said port door further includes a bolt mechanism for releasably securing said port door to said I/O port.

4. The system according to claim 1, wherein said port door further includes a magnet for releasably securing said port door to said I/O port.

5. The system according to claim 1, wherein said port door gripping assembly comprises a magnet.

6. The system according to claim 1, wherein said port door gripping assembly comprises a vacuum source.

7. The system according to claim 1, wherein said first side of said port door includes a support hole.

8. The system according to claim 7, wherein said end effector further includes a support device that protrudes into said support hole when said end effector is secured to said first side of said port door.

9. The system according to claim 1, wherein said end effector further includes a power couple device, said power couple device for supplying power to said port door so that said pair of latch keys may operate.

10. A wafer handling robot capable of transferring wafers between a SMIF pod and a processing tool, the SMIF pod having a pod door releasably secured to a pod shell, the processing tool having a port door releasably secured to an I/O port, the port door having a first side and a second side adapted to couple/decouple the pod door and pod shell and couple/decouple the port door and the pod door, the wafer handling robot comprising:
 a base;
 a first arm having first and second ends, said first end being operatively connected to said base;

a second arm having first and second ends, said first end being operatively connected to said second end of said first arm; and an end effector operatively connected to said second end of said second arm, said end effector including:
  a wafer transfer mechanism adapted to transport wafers between the SMIF pod and the processing tool; and
  a port door gripping mechanism having a port door mating device and a power supply, said port door mating device releasably securing said end effector to the first side of the port door so that the wafer handling robot may transfer the port door between the I/O port and a predetermined position within the processing tool, said power supply providing power to the port door so that the port door may couple/decouple the pod door and pod shell and couple/decouple the port door and the pod door.

11. The system according to claim 10, wherein said port door mating device comprises a magnet.

12. The system according to claim 10, wherein said port door mating device comprises a vacuum source.

13. The system according to claim 10, wherein the first side of the port door includes at least one support hole.

14. The system according to claim 13, wherein said end effector further includes at least one support device, said at least one support device protrudes into said at least one support hole when said end effector is secured to the first side of the port door.

15. A system for transferring workpieces, comprising:
  a container having a container door releasably secured to a container shell;
  a processing tool having a workpiece I/O port, said processing tool supporting said container such that said container door faces said workpiece I/O port;
  a port door having a first and second side and a latch assembly, said latch assembly releasably securing said port door to said workpiece I/O port, coupling/decoupling said container door and said container shell, and coupling/decoupling said container door and said port door; and
  a robot having an end effector, said end effector secured to said first side of said port door and having means for providing power to the port door so that said latch assembly may operate.

16. The system according to claim 15, wherein said latch assembly comprises a pair of latch keys and a bolt mechanism, said pair of latch keys for coupling/decoupling said container door and said container shell and for coupling/decoupling said :container door and said port door, said bolt mechanism for releasably securing said port door and said I/O port.

17. The system according to claim 15, wherein said means for securing said end effector to said first side of said port door comprises a magnet.

18. The system according to claim 15, wherein said means for securing said end effector to said first side of said port door comprises a vacuum source.

19. The system according to claim 15, wherein said first side of said port door includes a support hole.

20. The system according to claim 19, wherein said end effector further includes a support device being adapted to protrude into said support hole.

21. The system according to claim 20, wherein said means for providing power to said port door is integrated into said support device.

* * * * *